United States Patent [19]
Field et al.

[11] Patent Number: 5,882,532
[45] Date of Patent: Mar. 16, 1999

[54] FABRICATION OF SINGLE-CRYSTAL SILICON STRUCTURES USING SACRIFICIAL-LAYER WAFER BONDING

[75] Inventors: Leslie A. Field, Portola Valley; Paul P. Merchant, Belmont, both of Calif.

[73] Assignee: Hewlett-Packard Company, Palo Alto, Calif.

[21] Appl. No.: 656,624

[22] Filed: May 31, 1996

[51] Int. Cl.$^6$ .................................................. H01L 21/00
[52] U.S. Cl. .................................. 216/2; 438/50; 438/52; 438/593; 73/504.09; 360/97.01; 360/99.06; 360/99.08
[58] Field of Search .............................. 438/50, 52, 593; 216/2; 360/97.01, 99.06, 99.08; 73/504.09

[56] References Cited

U.S. PATENT DOCUMENTS

| | | | |
|---|---|---|---|
| 4,822,755 | 4/1989 | Hawkins | 438/21 |
| 5,091,331 | 2/1992 | Delgado | 438/458 |
| 5,500,910 | 3/1996 | Boudreau | 385/24 |
| 5,674,758 | 10/1997 | McCarthy | 148/DIG. 12 |

OTHER PUBLICATIONS

Masayoshi "Micromatching and micromechanism" JICST 89A0419003, 1989.
Ghandi, Sorab Khushro, "VLSI Fabrication Principles" John Wiley & Sibsm Inc., 1983, pp. 424–427.
Brosnihan, T.J. et al., "Micromatched Angular Accelerometer" University of California at Berkeley, Mar. 1996..
Nowoeolski, J. Mark, et al., "Fabrication of SOI Wafers with Buried Cavaties Using Silicon Fusion BOnding and Electrochemical Etchback", The 8th International Conference on Solid–State Sensors and Actuators, and Eurosensors IX, Stockholm, Sweden, Jun. 25–29, 1995, pp. 71–74.
Eng, Terry T.H. et al., "Surface–Micromachined Movable SOI Optical Waveguides", The 8th International Conference on Solid–State Sensors and Actuators, and Eurosensors IX, Stockholm, Swedenm Jun. 25–29, 1995, pp. 348–350..
Mastrangelo, C.H. et al., "Surface Micromachined Capacitive Differential Pressure Sensor with Lithographically–defined Silicon Diaphragm" The 8th International Conference on Solid–State Sensors and Actuators, and Eurosensors IX, Stockholm, Sweden, Jun. 25–29, 1995, pp. 613–615.
Smart Cut Technology, Semiconductor International, Oct. 1995, p. 102..
Miu, Denny K. et al., "Silicon Microgimblas for Super–Compact Magnetic Recording Rigid Disk Drives", Advanced Information Storage Systems, vol. 5, 1993, pp. 139–152.
Temesvary, Viktoria, et al., "Design, Fabrication and Testing of Silicon Microgimbals for super–compact Rigid Disk Drives", DSC–vol. 55–2, Dynamic Systems and Control, vol. 2, ASME 1994.
Miu, Denny K, et al., "Silicon Micromachined SCALED Technology", IEEE Transactions on Industrial Electronics, vol. 42, No. 3, Jun. 1995, pp. 234–239.

*Primary Examiner*—Ceila Chang
*Attorney, Agent, or Firm*—Ian Hardcastle

[57] ABSTRACT

A thin micromechanical device is fabricated in a way that is mechanically compatible with wafer handling for conventional-thickness wafers. A removable bonding layer bonds a fabrication wafer to a substantially conventional-thickness handle wafer to form a bonded wafer pair. The micromechanical device is formed in the fabrication wafer by subjecting the bonded wafer pair to processing including wafer handling for conventional-thickness wafers. The micromechanical device is formed to include part of the fabrication wafer. Finally, the bonding layer underlying the micromechanical device is removed to release the micromechanical device from the handle wafer.

19 Claims, 5 Drawing Sheets

FABRICATION OF SINGLE-CRYSTAL SILICON STRUCTURES USING SACRIFICIAL-LAYER WAFER BONDING

FIELD OF THE INVENTION

The present invention relates to micromachining, and, more particularly, to an improved method for releasing thin micromechanical devices from the substrates in which the devices have been fabricated by micromachining.

BACKGROUND OF THE INVENTION

Certain mechanical devices are now becoming miniaturized to such an extent that forming their components from traditional materials such as metals presents severe manufacturing problems. The semiconductor industry has developed many techniques for forming very small electronic components, such as transistors, in single-crystalline silicon at a very low cost per component. In *Silicon Micromachined SCALED Technology*, 42 IEEE TRANS. ON INDUSTRIAL MICROELECTRONICS, No. 3, 234–239 (1995), Denny K. Miu and Yu-Chong Tai describe fabricating miniature flexible mechanical devices from single-crystal silicon. Those used to thinking of single-crystal silicon as a hard, brittle substance might regard single-crystal silicon as an unlikely choice of material for making flexible mechanical devices. However, single-crystal silicon has a Young's modulus almost equal to that of steel. Single-crystal silicon about 40 $\mu$m (0.0015 mil.) thick is flexible and springy. Single-crystal silicon differs from steel in that it breaks when stressed beyond its ultimate strength instead of yielding. The main attraction of substituting single-crystal silicon for metals in fabricating flexible miniature mechanical devices is that the semiconductor industry's manufacturing techniques can be adapted to mass produce such devices at low cost.

An example of a flexible mechanical device that can be made with advantage from single-crystal silicon is the gimbal used to mount the record/playback head in the actuator arm in a hard disc drive. The rapidly-increasing data density demanded from such disc drives results in progressive reductions in the size of the head and the actuator arm, and, hence, in the gimbal. A requirement exists for gimbals having a maximum linear dimension of less than 1 mm and a thickness measured in tens of microns. The gimbal must mount the head on the actuator arm in a way that allows the actuator arm to move the head rapidly parallel to the surface of the disc, and that also allows the head to float on a film of air a few tens of nanometers thick between the head and the surface of the disc.

Typical micromechanical devices, such as gimbals, are difficult to make using a process that includes wafer handling for conventional-thickness wafers because of their extreme thinness, typically less than 20 $\mu$m. As noted above, single-crystal silicon wafers of this thickness are floppy and fragile, whereas wafer handling for conventional-thickness wafers is designed to operate with wafers that are rigid and over approximately 450 $\mu$m thick. The floppiness and fragility of 20 $\mu$m wafers makes such wafers impossible to process using wafer handling for conventional-thickness wafers.

Miu and Tai (above) describe a way of overcoming this problem by fabricating very thin micromechanical devices, gimbals, in conventional-thickness single-crystal silicon wafers. Part-way through the fabrication process, the back side of the conventional-thickness wafer is masked with a potassium hydroxide (KOH)-resistant mask, apertures positioned under each micromechanical device are formed in the mask, and the wafer is subject to an anisotropic back etch in which the wafer is etched from its back side using a KOH etchant. The etching process forms a deep pit under each micromechanical device in the conventional-thickness wafer. Each pit is capped by a membrane of the wafer that includes one micromechanical device.

The technique of performing a timed anisotropic etch from the back side of the wafer has several disadvantages, even though it enables very thin micromechanical devices to be produced by processing conventional-thickness silicon wafers using wafer handling for conventional-thickness wafers. First, the process is very wasteful of the area of the silicon wafer. The angle of the side walls of the pits etched in a <100> wafer is about 54.7° to the surface of the wafer. The dimensions of typical current micromechanical devices are of the same order as the thickness t of a conventional-thickness wafer. Thus, as can be seen in FIG. 1, the width $w_w$ of the wafer 1 required to accommodate the micromechanical device 3 is over twice the width $w_g$ of the micromechanical device itself. The area of the wafer effectively occupied by each micromechanical device is more than three times the area of the micromechanical device. The large effective area of each micromechanical device reduces the number of micromechanical devices of a given size that can be fit on a silicon wafer of a given size by a factor of the order of three. Making so few micromechanical devices on each wafer increases the manufacturing cost of each micromechanical device, because the cost of processing the wafer is divided among significantly fewer micromechanical devices.

A second disadvantage of performing a timed anisotropic etch from the back side of the wafer is that the etch removes a large amount of material from the conventional-thickness wafer, and leaves the conventional-thickness wafer in a weakened condition. Consequently, the process is preferably performed towards the end of the process of fabricating the micromechanical devices. However, no KOH-incompatible elements, such as aluminum lead patterns, can be included in the micromechanical devices before the KOH back etch. This means that at least part of the fabrication of the micromechanical devices must be performed with the wafer in its weakened state, with consequent steps being required to reduce the risk of the weakened wafer breaking.

Finally, a timed anisotropic etch performed from the back side of the wafer can result in micromechanical devices having poor thickness uniformity, and having a rough back surface. A rough back surface promotes stress cracking, which can impair the reliability of the micromechanical devices.

Accordingly, an improved method for making thin micromechanical devices in single-crystal silicon using processing including wafer handling for conventional-thickness wafers is required. The method must be mechanically compatible with semiconductor fabrication processing that includes wafer handling for conventional-thickness wafers, and must enable many more micromechanical devices to be made on each wafer to reduce the manufacturing cost per device. The method must also reduce the amount that weakened or fragile wafers have to be handled during the production process, and must produce micromechanical devices with a superior thickness uniformity and that are not subject to stress cracking.

SUMMARY OF THE INVENTION

The invention provides a method for fabricating a thin micromechanical device in a way that is mechanically compatible with wafer handling for conventional-thickness wafers. In the method, a fabrication wafer and a substantially conventional-thickness handle wafer are provided. The fabrication wafer is bonded to the handle wafer by a removable bonding layer to form a bonded wafer pair. The micromechanical device is formed in the fabrication wafer by subjecting the bonded wafer pair to processing including wafer handling for conventional-thickness wafers. The micromechanical device is formed to include part of the fabrication wafer. Finally, the bonding layer underlying the micromechanical device is removed to release the micromechanical device from the handle wafer.

A fabrication wafer of conventional thickness may be provided, in which case, the micromechanical device is formed in the fabrication wafer by reducing the thickness of the fabrication wafer to the thickness required for fabricating the micromechanical device. The thickness of the fabrication wafer may be reduced to a thickness in a range from about 10 $\mu$m to about 200 $\mu$m.

The removable bonding layer may be a layer of a material chosen from a group consisting of phosphosilicate glass, arsenic glass, boron glass, borophosphosilicate glass, low-temperature oxide and thermal oxide, and is preferably a layer of phosphosilicate glass.

The micromechanical device may be formed by etching through the fabrication wafer from its front face to form a trench, and the bonding layer underlying the micromechanical device may be removed by applying an etchant to the bonding layer via the trench.

The fabrication wafer may be etched through anisotropically. An HF-based etchant may be applied to remove the bonding layer.

The micromechanical device may be formed by etching through the fabrication wafer to form a trench surrounding the micromechanical device. The trench separates the micromechanical device from the fabrication wafer, and may define the shape of the micromechanical device and the shape of other features of the micromechanical device formed by etching through the fabrication wafer. The trench is interrupted by at least one tether connecting the micromechanical device to the fabrication wafer. The fabrication wafer is etched through from a face of the fabrication wafer remote from the handle wafer. Removing the bonding layer underlying the micromechanical device then releases the micromechanical device from the handle wafer but leaves the micromechanical device connected to the fabrication wafer by the tether. The micromechanical device may be released from the fabrication wafer by breaking the tether. Further processing may be applied to the micromechanical device after the bonding layer is removed and before the tether is broken.

A tether anchor may be defined in the fabrication wafer by etching through the fabrication wafer. The tether anchor is connected to the micromechanical device by the tether, and to the handle wafer by part of the bonding layer. The tether anchor is dimensioned to have an undercut etch distance greater than the maximum undercut etch distance of the micromechanical device. When the bonding layer underlying the micromechanical device is removed, part of the bonding layer underlying the tether anchor remains to keep the micromechanical device attached to the handle wafer by the tether anchor and the tether.

The invention also provides a method for fabricating a thin micromechanical device in a way that is mechanically compatible with wafer handling for conventional-thickness wafers. In the method, a fabrication wafer and a substantially conventional-thickness handle wafer are provided. The fabrication wafer is bonded to the handle wafer by a removable bonding layer to form a bonded wafer pair. The micromechanical device is formed in the fabrication wafer by subjecting the bonded wafer pair to processing including wafer handling for conventional-thickness wafers. The micromechanical device is formed to include part of the fabrication wafer. The micromechanical device is formed by etching through the fabrication wafer to form a trench surrounding the micromechanical device. The trench separates the micromechanical device from the fabrication wafer, and may define the shape of the micromechanical device and the shape of other features of the micromechanical device formed by etching through the fabrication wafer. The trench is interrupted by at least one tether connecting the micromechanical device to the fabrication wafer. The fabrication wafer is etched through from its face remote from the handle wafer. The bonding layer underlying the micromechanical device is removed to release the micromechanical device from the handle wafer, but the micromechanical device remains connected to the fabrication wafer by the tether. Finally, the tether is broken to release the micromechanical device from the fabrication wafer.

Finally, the invention provides a method for fabricating a thin micromechanical device in a way that is mechanically compatible with wafer handling for conventional-thickness wafers. In the method, a fabrication wafer and a substantially conventional-thickness handle wafer are provided. The fabrication wafer is bonded to the handle wafer by a removable bonding layer to form a bonded wafer pair. The micromechanical device is formed in the fabrication wafer by subjecting the bonded wafer pair to processing including wafer handling for conventional-thickness wafers. The micromechanical device is formed to include part of the fabrication wafer. The micromechanical device is formed by anisotropically etching through the fabrication wafer to form a trench surrounding the micromechanical device. The trench separates the micromechanical device from the fabrication wafer, and may define the shape of the micromechanical device and the shape of other features of the micromechanical device formed by etching through the fabrication wafer. Etching through the fabrication wafer additionally defines a tether anchor in the fabrication wafer. The trench is interrupted by at least one tether connecting the micromechanical device to the tether anchor. The tether anchor is dimensioned to have an etch distance greater than the maximum etch distance of the micromechanical device. The fabrication wafer is anisotropically etched through from its face remote from the handle wafer. The bonding layer underlying the micromechanical device is removed to release the micromechanical device from the handle wafer, but removing the bonding layer leaves the micromechanical device connected to the bonded wafer pair by the tether, the tether anchor and part of the bonding layer underlying the tether anchor. Finally, the tether is broken to release the micromechanical device from the bonded wafer pair.

DETAILED DESCRIPTION OF THE INVENTION

Figure 1:
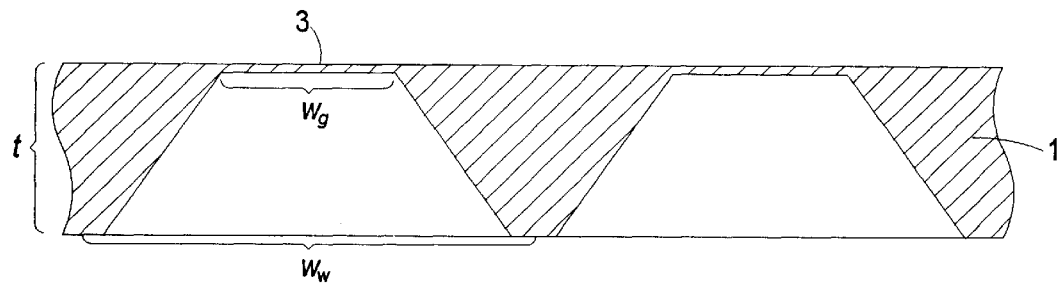
FIG. 1 is a cross-sectional view showing a thin membrane of single-crystal silicon formed by anisotropically etching a conventional-thickness wafer from its back side.

In the method according to the invention, a micromechanical device is formed by processes such as etching, materials deposition, masking and etching, in a thin fabrication wafer of single-crystal silicon. The method enables micromechanical devices having a thickness in the range from about 10 µm to about 200 µm to be made. Micromechanical devices in this thickness range are difficult to make using conventional techniques. Forming layers thicker than about 10 µm is difficult using conventional deposition processes. Conventional wafer handling techniques are designed for use with wafers thicker than about 200 µm. Fabrication wafers in the thickness range of about 10 µm to about 200 µm are brittle and floppy, which makes it difficult to make micromechanical devices by processing such wafers using wafer handling for conventional-thickness wafers. The method according to the invention makes such fabrication wafers mechanically compatible with wafer handling for conventional-thickness wafers. Each fabrication wafer is bonded to a conventional-thickness handle wafer using a removable bonding layer. The fabrication wafer attached to the handling wafer constitutes a bonded wafer pair.

The bonded wafer pair may be formed by bonding a thin fabrication wafer of the required thickness to the handle wafer. Alternatively, the bonded wafer pair may be formed by attaching a conventional-thickness fabrication wafer to the handle wafer, and processing the bonded wafer pair to reduce the thickness of the fabrication wafer to that required for making the micromechanical devices, i.e., to a thickness in the range from about 10 µm to about 200 µm. The bonded wafer pair may be subject to a regular semiconductor wafer thickness reducing process to reduce the thickness of the fabrication wafer.

The micromechanical devices are then fabricated in the fabrication wafer by subjecting the bonded wafer pair to semiconductor fabrication processing including wafer handling for conventional-thickness wafers. The fabrication processing may include an etch step that etches through the fabrication wafer to divide each of the micromechanical devices from the fabrication wafer. The fabrication wafer is etched from its front face, the face remote from the handle wafer. This etch is preferably an anisotropic etch. The bonded wafer pair is finally subject to a bonding release etch step that dissolves the bonding layer, and releases each of the micromechanical devices from the bonded wafer pair. This step also releases the fabrication wafer from the handle wafer.

In alternative versions of the method according to the invention, the etch step, which separates each micromechanical device at its periphery from the fabrication wafer, leaves the micromechanical device attached to the fabrication wafer by a number of narrow bridges called "tethers." The bonding release etch step releases each micromechanical device in the fabrication wafer from the handle wafer, but leaves the micromechanical device attached by its tethers either to the fabrication wafer or to the handle wafer via part of the bonding layer that is not removed in the bonding release etch step.

The first of the variations also allows additional fabrication processing that is incompatible with the bonding release etch step to be performed with the micromechanical devices attached to the fabrication wafer. The second of the variations allows such additional fabrication processing to be performed with the micromechanical devices attached to the bonded wafer pair. After the additional fabrication processing is complete, the micromechanical devices can then be picked out from the fabrication wafer by a conventional semiconductor chip handling device, which breaks the tethers while picking out the devices.

Figure 2:
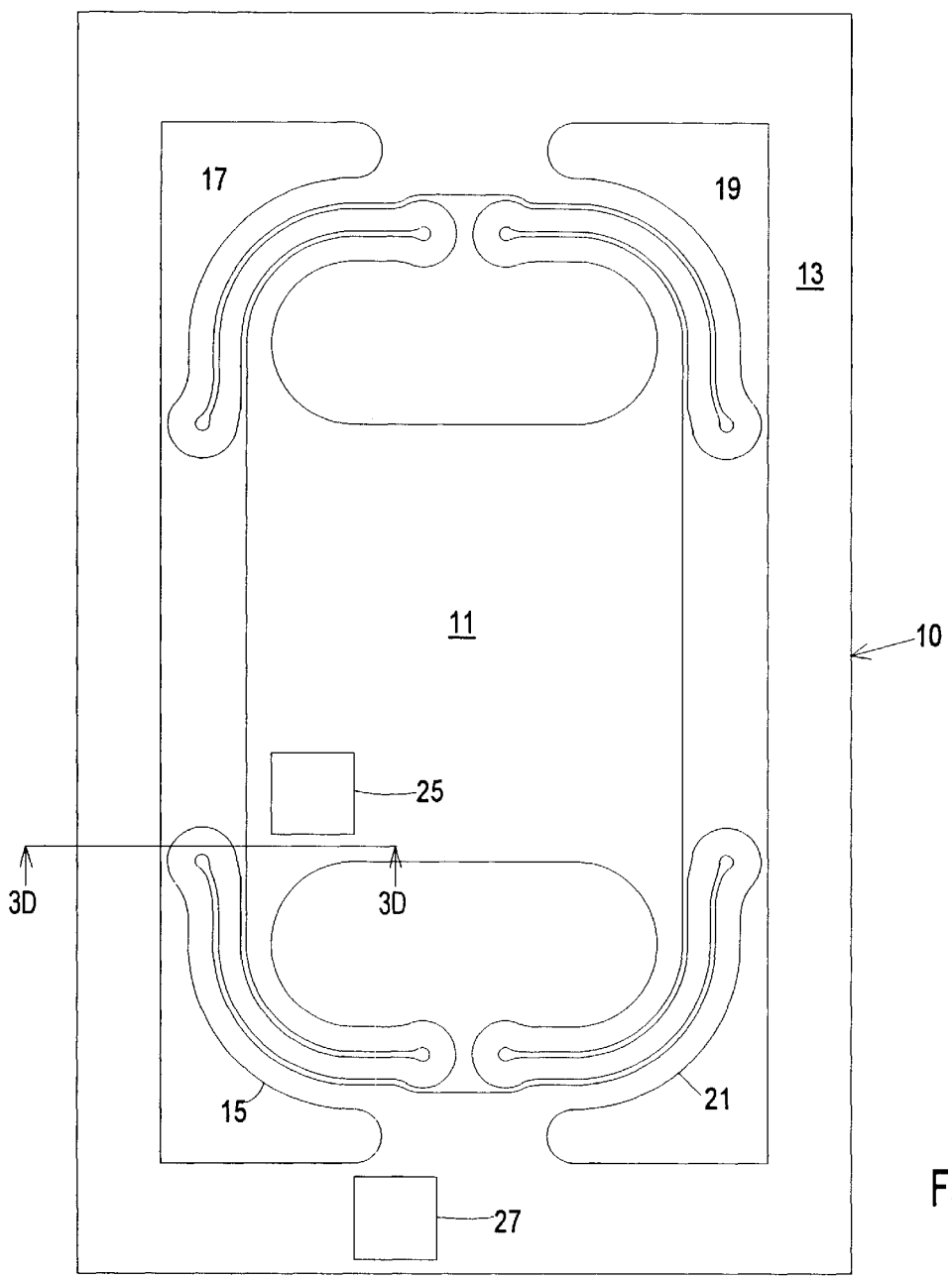
FIG. 2 is a plan view of a single-crystal silicon gimbal 10 as an example of a thin micromechanical device that can be made using the method according to the invention.

FIG. 2 is a plan view of a typical single-crystal silicon gimbal 10 as an example of a thin micromechanical device that can be made using the method according to the invention. The method according to the invention is not limited to making gimbals: the method according to the invention can be used to make many other types of active and passive micromechanical devices from single-crystal silicon or other semiconductor materials. Examples of other types of micromechanical devices include micromechanical valves, micromechanical sensors and micromechanical actuators.

In the gimbal 10, the head platform 11 is connected to the mounting frame 13 by the serpentine mounting springs 15, 17, 19, and 21. One mounting spring connects each corner of the head platform to the mounting frame. The mounting springs are shaped to provide much greater compliance in the direction perpendicular to the plane of the drawing than in the plane of the drawing. This enables the record/playback head mounted on the gimbal to follow the contours of the hard disc over which it flies on a thin film of air, while enabling the actuator arm to change the radial position of the head rapidly relative to the disc.

In a typical hard disc drive, the record/playback head is mounted on the head platform 11, and the mounting frame 13 is mounted on one end of the actuator arm. The hard disc drive, the hard disc, the record/playback head and the actuator arm are not shown in FIG. 2 to simplify the drawing. The gimbal 10 also includes the conductive pad 25 on the head platform and the pad 27 on the mounting frame. The pads 25 and 27 may be used to make electrical connections to the record/playback head. Additional pads may be located on the head platform and the mounting frame, but are not shown to simplify the drawing.

The method according to the invention will now be described in detail with reference to FIGS. 3A–3H. These figures show part of the gimbal 10 of FIG. 2 as an example of a micromechanical device being made using the method according to the invention. As noted above, the method is not limited to making such gimbals, and can easily be adapted to make other micromechanical devices. FIGS. 3A–3H show cross sectional views of the bonded wafer pair as the various steps of the method are performed. FIGS. 3D–3H show the part of the gimbal 10 indicated by the line 3D—3D in FIG. 2.

Since the thicknesses of the wafers and layers shown in the drawings range from several hundred microns to less than one micron, the thicknesses of the wafers and layers are not drawn to scale. However, the wafers are shown as having a greater thickness than the layers deposited on them, and the fabrication wafer is shown with a smaller thickness after it has been thinned than before.

Figure 3A:
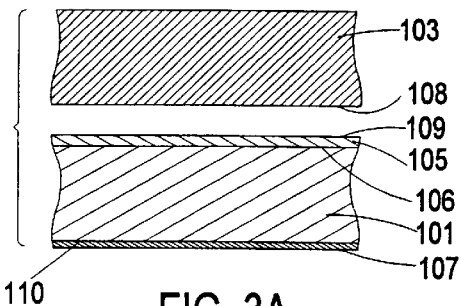
FIGS. 3A–3H are cross sectional views of the handle wafer and the fabrication wafer illustrating the steps of the method according to the invention.

FIG. 3A shows the handle wafer 101, and the fabrication wafer 103 before they are bonded together to form the bonded wafer pair 113. Both the handle wafer and the fabrication wafer are preferably wafers of single-crystal silicon. The handle wafer is preferably a conventional-thickness wafer. A conventional-thickness wafer is a wafer having a thickness in the range that is routinely processed using conventional wafer handling appropriate for the diameter of the wafer. Wafer handling for 100 mm diameter conventional-thickness wafers is designed to operate with wafers that are about 525−90/+50 $\mu$m thick. Wafer handling for larger-diameter conventional-thickness wafers is designed to operate with thicker wafers. For example, wafer handling for 150 or 200 mm diameter conventional-thickness wafers is usually designed to operate with wafers that are respectively about 800 and 1000 $\mu$m thick. If the fabrication wafer is greater than about 100 $\mu$m thick, the handle wafer should have a less-than-conventional thickness to enable the bonded wafer pair to have a thickness in the conventional range.

A conventional-thickness wafer may also be used as the fabrication wafer 103. If a conventional-thickness wafer is used as the fabrication wafer, the thickness of the fabrication wafer is uncritical because the fabrication wafer is thinned to the required thickness in the course of performing the method. Otherwise, the thickness of the fabrication wafer should be that of the micromechanical devices being made. For example, when the method is used to make the gimbal 10, the thickness of the fabrication wafer is in the range of about 10 $\mu$m to about 20 $\mu$m.

Very thin single-crystal silicon wafers of a thickness suitable for use as the fabrication wafer 103 without thickness reduction are commercially available. The bonding step that will be described below can be used to bond such a thin fabrication wafer to the conventional-thickness handle wafer 101 to form the bonded wafer pair 113. However, in view of the extreme fragility of such thin fabrication wafers, the fabrication wafer must be handled with great care to keep it in one piece before it is bonded to the handle wafer. Accordingly, in the preferred way of performing the method according to the invention, a fabrication wafer of conventional thickness is bonded to the handling wafer to form the bonded wafer pair 113, and the bonded wafer pair is subject to thickness reduction processing to reduce the thickness of the fabrication wafer to the thickness required for making the micromechanical devices.

FIG. 3A also shows the releasable bonding layer 105 deposited on the surface 106 of the handle wafer 101. The bonding layer may alternatively be deposited on the surface 108 of the fabrication wafer 103, or on both the surfaces 106 and 108 of the handle wafer and the fabrication wafer, respectively. The bonding layer forms a strong, void-free bond with each wafer constituting the bonded wafer pair to hold the bonded wafer pair together throughout the processing to which the bonded wafer pair is subject. The bonding layer is also easily removed from under the micromechanical devices when fabrication of the micromechanical devices is complete to release the micromechanical devices from the bonded wafer pair. The bonding layer is preferably a thick layer of phosphosilicate glass (PSG). The bonding layer may be deposited on the respective wafer using a conventional low-pressure chemical vapor deposition (LPCVD) process. The bonding layer may alternatively be deposited by sputtering, or may be spun on.

The bonding layer preferably has a thickness in the range of 1–10 $\mu$m, although thinner bonding layers are useable. A bonding layer thickness towards the upper end of the above-stated range is preferred because such a bonding layer thickness increases the rate at which the bonding release etch step dissolves the bonding layer. A thicker bonding layer also reduces the likelihood that the surface tension of the bonding release etchant will cause the micromechanical devices to stick to the handle wafer after the bonding layer has been dissolved.

The handle wafer 101 also has the protective layer 107 deposited on its back surface 110, remote from the surface 106 on which the bonding layer 105 is deposited. The protective layer protects the back surface of the handle wafer during subsequent processing. In particular, the protective layer protects the back surface of the handle wafer from being etched in any chemical etching steps applied to the fabrication wafer. The protective layer may be, for example, a layer (<1 $\mu$m thick) of silicon nitride.

Figure 3E:
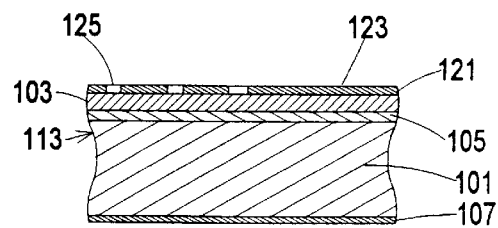
Figure 3B:
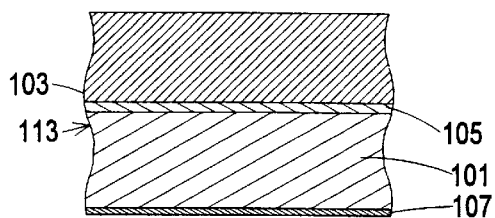

Before bonding the fabrication wafer 103 to the handle wafer 101, the surface 108 of the fabrication wafer and the surface 111 of the bonding layer 105 are thoroughly cleaned, using a conventional cleaning process for fusion bonding. For example, reverse RCA cleaning can be used. In this, the surfaces are successively washed in piranha, RCA2 and RCA1. Piranha is a mixture of sulphuric acid and hydrogen peroxide heated to about 120° C. RCA2 is a mixture of water, hydrochloric acid and hydrogen peroxide heated to about 80° C., and RCA 1 is a mixture of water, ammonium hydroxide and hydrogen peroxide heated to about 80° C. The surface 108 of the fabrication wafer is then placed in intimate contact with the surface 109 of the bonding layer 105. Hydrophilic bonding between the surfaces 108 and 109 causes the wafers to stick to one another. The wafers are then placed in a furnace and are annealed at a temperature in the range of 900°–1100° C. in a nitrogen or other suitable atmosphere for about one hour. This causes the bonding layer 105 to bond the handle wafer and the fabrication wafer together. The bonded wafer pair 113 resulting from bonding the fabrication wafer to the handle wafer is shown in FIG. 3B.

If the fabrication wafer 103 is a conventional-thickness wafer, the wafers are preferably mounted vertically in the annealing furnace to use the furnace space with optimum efficiency. However, if the fabrication wafer is a very thin wafer, the wafers are preferably mounted in the annealing furnace with the surfaces 108 and 109 horizontal, and the upper wafer is weighted to insure an intimate contact between the surfaces 108 and 109.

If the fabrication wafer 103 has the thickness required for making the micromechanical devices, the following step is omitted. Otherwise, the bonded wafer pair 113 is subject to a thinning process to reduce the thickness of the fabrication wafer 103 to that required to make the micromechanical devices. For example, to make the gimbals 10, the thickness of the fabrication wafer is reduced to a thickness in the range of about 10 μm to about 20 μm. The thickness of the fabrication wafer may be reduced by subjecting the bonded wafer pair 113 to a lapping and polishing process similar to that commonly used in the production of semiconductor wafers.

Alternatively, the thickness of the fabrication wafer 103 may be reduced by subjecting the bonded wafer pair 113 to wet etching. To define the eventual thickness of the fabrication wafer after etching, the fabrication wafer may have an etch stop layer (not shown) formed under the surface 108 before the fabrication wafer is bonded to the handle wafer. The bonded wafer pair 113 is then etched using, for example, KOH to reduce the thickness of the fabrication wafer. The KOH rapidly erodes the fabrication wafer, but the protective layer 107 protects the back surface 110 of the handle wafer, so the thickness of the handle wafer remains unchanged. Etching continues until the etch stop layer is reached.

Figure 3F:
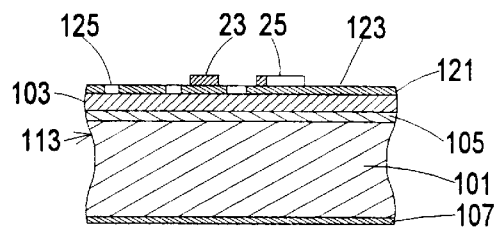
Figure 3C:
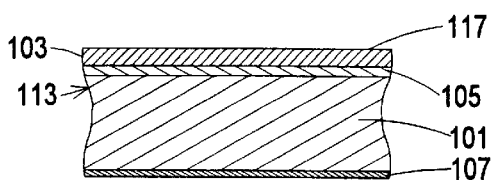

FIG. 3C shows the bonded wafer pair ready to start fabricating the micromechanical devices. In FIG. 3C the fabrication wafer 103, having a thickness suitable for making the micromechanical devices, is bonded to the handle wafer 101 by the bonding layer 105. If the fabrication wafer has been subject to thinning after it was attached to the handle wafer, the surface 117 of the fabrication wafer is polished to prepare the fabrication wafer for making the micromechanical devices.

The micromechanical devices are formed in the fabrication wafer 103 by subjecting the bonded wafer pair 113 to semiconductor fabrication processing such as etching, selective deposition of impurities, dielectrics and conductors, mask and etch steps, etc. using wafer handling for conventional-thickness wafers. Multiple micromechanical devices are formed in the fabrication wafer of each bonded wafer pair so that the cost of processing each fabrication wafer is divided among many micromechanical devices. This substantially reduces the cost of making each micromechanical device.

Figure 3G:
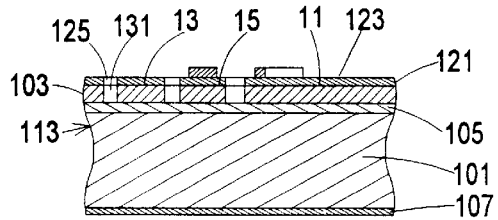
Figure 3D:
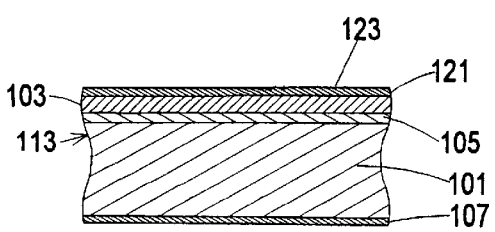

To form the micromechanical devices, a thin layer 121 of an etch resist material is deposited on the surface 117 of the fabrication wafer 103, as shown in FIG. 3D. The etch resist material may be silicon dioxide or silicon nitride, for example, and is typically deposited by LPCVD to form a layer less than about 1 μm thick. Alternatively, the etch resist material may be a layer of thermally-grown silicon dioxide. The layer of etch resist material is then masked and selectively etched using a conventional mask and etch process. As shown in FIG. 3E, this forms an etch mask by creating apertures in the layer of etch resist. The apertures expose the parts the surface 117 of the fabrication wafer 103 through which the fabrication wafer will later be etched by a separation etch performed through the surface 117. For example, the mask and etch step forms the aperture 125 through which a trench will later be etched, preferably by an anisotropic etch, to separate the micromechanical device from the fabrication wafer 103 and to define the shape of the micromechanical device. The etch mask can also be used to define the shape of other features of the micromechanical device formed by etching through the fabrication wafer in the separation etch step. For example, in the gimbal 10, apertures in the etch resist layer 121 define the shape of the serpentine springs 15–21, and define the material removed from the fabrication wafer to separate the head platform 11 from the mounting frame 13.

After the etch resist layer 121 has been deposited on the fabrication wafer 103 and has been patterned as just described to form the etch mask, the bonded wafer pair 113 is subject to further processing to fabricate the micromechanical device. This further processing is specific to the particular micromechanical device being made. In this disclosure, the step of forming the pads 25 and 26 (FIG. 2) on the gimbal 10 will be described with reference to FIG. 3F as an example of the many different kinds of processing that can be performed on the bonded wafer pair using semiconductor fabrication processing with wafer handling for conventional-thickness wafers to make micromechanical devices in the thin fabrication wafer 103.

To form the pads 25 and 26 on the gimbal 10, the bonded wafer pair 113 is processed to deposit a layer of metal (not shown) on the surface 123 of the etch resist layer 121. The metal may be aluminum, copper or gold, for example, and may be deposited by sputtering, evaporation, plating or another suitable method. The metal layer is masked to define the shapes of the pads 25 and 27, and is then etched to form the pads 25 and 27, as shown in FIG. 3F.

The step of separating the micromechanical device, for example, the gimbal 10, from the fabrication wafer 103 and of forming other features of the micromechanical device by removing part of the fabrication wafer by etching will now be described with reference to FIG. 3G. As noted above, the shape of the micromechanical device, and the shapes of such other features of the micromechanical device formed by etching through the fabrication wafer, are defined by the pattern of apertures in the etch mask formed in the etch resist layer 121 by the step described above with reference to FIG. 3E.

The bonded wafer pair 113 is subject to a separation etch. The separation etch is preferably an anisotropic dry etch, such as a reactive ion etch (RIE), using the etch mask formed in the etch resist layer 121. The separation etch etches through the thickness of the fabrication wafer 103 from the surface 117, remote from the handle wafer 101. The separation etch proceeds until the bonding layer 105 is reached. The separation etch separates the micromechanical devices formed in the fabrication wafer from the fabrication wafer, and, in the gimbal 10, forms the head mounting platform 11, the mounting frame 13, and the serpentine springs 15–21. However, at the end of the separation etch, each micromechanical device remains attached to the handle wafer 101 by the bonding layer 105.

The bonding release etch step, in which the micromechanical devices are released from the handle wafer 101, will now be described with reference to FIG. 3H. To release the micromechanical devices from the handle wafer, the bonded wafer pair 113 is immersed in a wet etchant capable of rapidly etching the bonding layer 105, but which does not etch any of the other parts of the micromechanical devices. Preferably, the bonding layer is a thick layer of phosphosilicate glass (PSG). A hydrofluoric acid (HF)-based etchant etches PSG much more rapidly than it etches any of the other elements of the micromechanical devices. Suitable HF-based etchants include concentrated HF, 10:1 HF, or so-called buffered oxide etch, a mixture of hydrofluoric acid, ammonium fluoride and water.

The HF-based etchant reaches the bonding layer 105 via the apertures, such as the aperture 125 formed in the etch resist layer 121 in the step described above with reference to FIG. 3E, and through the underlying trenches, such as the trench 131, etched through the fabrication wafer 103 by the separation etch described above with reference to FIG. 3G. This is indicated by the arrows 129. In the bonding release etch step, the etch fronts 127 advance through the bonding layer under the fabrication wafer from the trenches in the fabrication wafer. The preferred large thickness of the bonding layer helps the etchant to circulate freely in the space between the fabrication wafer and the handle wafer 101 and to deliver fresh etchant to the etch fronts.

Figure 3H:
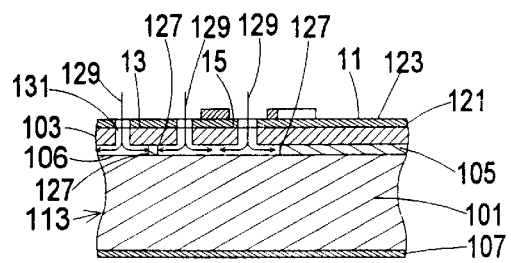

FIG. 3H shows the bonded wafer pair 113 part-way through the bonding release etch step. The serpentine spring 15 is shown fully released from the handle wafer 101, and the mounting frame 13 is shown partially released from the handle wafer. However, the greater width of the head platform 11 means that much more etching time is required before the head platform will be fully released from the handle wafer.

As the bonding release etch step removes the last of the bonding layer 105 from under each micromechanical device, the micromechanical devices are released from the bonded wafer pair 113. The completed micromechanical devices can then be removed from the etching tank, and washed and dried ready for assembly into disc drives. The bonding release etch step also releases from the handle wafer 101 the parts of the fabrication wafer 103 that do not form the micromechanical devices.

The method according to the invention enables many more micromechanical devices to be made on each fabrication wafer 103 than the known method described above. For example, at least three times as many gimbals having sides about 1 mm long can be made on a 100 mm-diameter wafer using the method according to the invention than with known methods.

An additional advantage of the method according to the invention is that it does not subject the fabrication wafer to a prolonged KOH etch step after the start of forming the micromechanical devices in the fabrication wafer. If the thickness of the fabrication wafer is reduced by lapping and polishing, KOH etch steps can be eliminated entirely. In contrast with known methods, this enables processing steps that are not KOH-etch compatible to be performed, and materials that are not KOH-etch compatible to be used.

Another advantage of the method according to the invention over the known fabrication method is that the micromechanical devices produced have a greater strength, and a greater resistance to fatigue failure. This is because the method enables both surfaces of the fabrication wafer 103 to be finished surfaces, which are smooth and crack-free. The absence of cracks increases both the strength of the resulting micromechanical devices, and the resistance of the micromechanical devices to fatigue failure. This quality is especially important in a gimbal. The gimbal is subject to high stresses as the actuator arm applies force via the gimbal to accelerate the head. Moreover, the serpentine springs are subject to constant flexing as the head flies over the surface of the disc. This quality is also important in many other types of micromechanical devices.

As noted above, phosphosilicate glass (PSG) is the preferred material of the bonding layer 105. This material is preferred for a number of reasons. First, PSG etches quickly using an HF-based etchant. Second, a thick layer of PSG, as much as about 10 $\mu$m thick, for example, can easily be deposited using a conventional LPCVD deposition process. A thick bonding layer enables the bonding release etchant to circulate freely to the etch fronts during the bonding release etch step in which the micromechanical devices are released from the handle wafer. This reduces the time required to release the micromechanical devices from the handle wafer, and hence reduces the time that the micromechanical devices are exposed to the HF-based bonding release etchant. A thick bonding layer also reduces the ability of the surface tension of the bonding release etchant to cause the released micromechanical devices to stick to the handle wafer after they have been released from the handle wafer. This property is especially important in the variations to be described below in which the micromechanical devices remain connected to the bonded wafer pair after the bonding layer underlying the micromechanical devices has been removed.

A third advantage of PSG is that its bonding temperature is sufficiently high to maintain the structural integrity of the bonded wafer pair 113 during handling of the bonded wafer pair by wafer handling for conventional-thickness wafers in a wide range of regular semiconductor fabrication processes. This ability is especially important if the bonded wafer pair is subject to semiconductor fabrication processes in which high temperatures are used, for example, impurity diffusion. The bonded wafer pair could be subject to impurity diffusion if it is processed to form semiconductor circuit elements, such as transistors, on part of the micromechanical device. For example, in the gimbals described above, semiconductor circuit elements constituting a preamplifier could be formed in the single-crystal silicon of the head platform 11.

A fourth advantage of PSG is that, compared with other oxides, PSG can be deposited in thick layers with a very low stress. For example, the stress in a layer of PSG about 9 $\mu$m thick can be as low as about $3 \times 10^7$ Newton m$^{-2}$. A low stress level reduces the ability of stress in the bonding layer 105 to distort the micromechanical devices made in the fabrication wafer 103.

The phosphorus content of the PSG of the bonding layer 105 determines the rate at which the bonding layer can be etched in the bonding release etch step, the rate of etch increasing with increased phosphorus content. The phosphorus content of the PSG also determines the built-in tensile stress of the PSG layer, the tensile stress decreasing with increased phosphorus content. Finally, the phosphorus content of the PSG determines the coefficient of thermal expansion of the PSG. The thermal expansion coefficient increases to more closely match that of silicon with an increased phosphorus content. A good match with the thermal expansion coefficient of silicon is obtained at a phosphorus content of about 15 wt. % phosphorus pentoxide. However, increasing the phosphorus content makes the PSG bonding layer more hygroscopic.

In a practical embodiment, the phosphorus content was 7.2 mole % (15.5 wt. %) phosphorus pentoxide, which gave a good compromise between etch rate, tensile stress and expansion coefficient on one hand and water absorption on the other. An acceptable phosphorus content is in the range of 0–10 mole % (0–21.5 wt. %) phosphorus pentoxide.

Phosphorus levels towards the lower end of the above range are required if diffusion of phosphorus from the bonding layer into the fabrication wafer is undesirable, such as when active devices are formed by diffusing impurities into the fabrication wafer 103. If no diffusion of phosphorus can be tolerated, the phosphorus content of the bonding layer could be reduced to zero. In this case, the bonding layer would be a layer of low-temperature oxide. Since the etch rate of PSG decreases as the phosphorus content is decreased, low temperature oxide would have a slower etch rate than that of PSG. Alternatively, diffusion of phosphorus from the bonding layer into the fabrication wafer could be reduced by depositing a thin layer of silicon nitride on the surface 108 of the fabrication wafer before the fabrication wafer is bonded to the handle wafer to form the bonded wafer pair.

Boron glass could be used as the bonding layer 105. Boron glass has a bonding temperature of about 450° C., which is lower than that of PSG, so it is possible that de-bonding of the bonded wafer pair may occur at lower temperatures than with a PSG bonding layer. However, the ability of the bonding layer to maintain the structural integrity of the bonded wafer pair at high temperatures is less important if the bonded wafer pair is not subject to high temperatures during fabrication of the micromechanical devices. Thus, boron glass could be used as the bonding layer if the bonded wafer pair is not to be subject to impurity diffusion while fabricating the micromechanical devices. Boron glass is difficult to etch, but its etching properties are good enough for it to be usable as the bonding layer. Boron may also be added to PSG to produce boro-phosphosilicate glass (BPSG).

Arsenic glass could be used as the bonding layer 105. Arsenic glass has a bonding temperature of about 350° C., which is lower than that of PSG, so it is possible that de-bonding of the bonded wafer pair may occur at lower temperatures than with a PSG bonding layer. However, as with boron glass, arsenic glass may be used, especially if the bonded wafer pair is not subject to high temperatures during fabrication of the micromechanical devices.

Thermal oxide grown on either or both the handle wafer 101 and the fabrication wafer 103 may also be used as the bonding layer 105. The wafers would be bonded together using a thermal oxide bonding layer by a process similar to that described above, with a temperature in the range of about 900°–1200° C. and a time in the range of about one hour to about four hours.

However, time required for the bonding release etch step with a thermal oxide bonding layer is much longer than that required for the bonding release etch step with a PSG bonding layer because thermal oxide etches more slowly than PSG, and because the thickness of a typical thermal oxide bonding layer is much less than that of a typical PSG bonding layer. The smaller thickness of the thermal oxide layer causes the bonding release etchant to circulate to the etch fronts much more slowly than with a typical thick PSG bonding layer. The longer etch time required to release the micromechanical devices from a thermal oxide bonding layer compared with that required to release them from a PSG bonding layer means that the completed micromechanical devices are exposed to an HF-containing etch for a much longer time. This increased exposure to HF reduces the number of processes that can be performed on the micromechanical devices before they are released from the handle wafer. Thermal oxide has higher stress than a similar thickness of PSG.

Typical micromechanical devices are so small and light that the efficiency of production processes using such devices is enhanced by keeping the micromechanical devices attached to the handle wafer 101 for as much of the production process as possible. However, the bonding release etch step, which uses an HF-based etchant to release the micromechanical devices from the handle wafer, sets a practical limit to the production processes that can be performed with the micromechanical devices still attached to the handle wafer. To increase the number of production processes that can be performed with the micromechanical devices still attached to the handle wafer, the basic method according to the invention can be modified to include a two-step release.

In the two-step release, the micromechanical devices remain partially attached at least to the fabrication wafer by tethers after the bonding release etch is performed. After additional processing is performed with the micromechanical devices attached at least to the fabrication wafer by the tethers, the micromechanical devices are fully released by breaking the tethers. This two step release enables the micromechanical devices to remain attached at least to the fabrication wafer, and, preferably, also to the handle wafer, after the bonding release etch step has removed the bonding layer underlying the micromechanical devices. The modified method can also reduce the ability of the surface tension of the bonding release etchant to stick the micromechanical devices to the handle wafer after the bonding release etchant has dissolved the bonding layer.

Figure 4A:
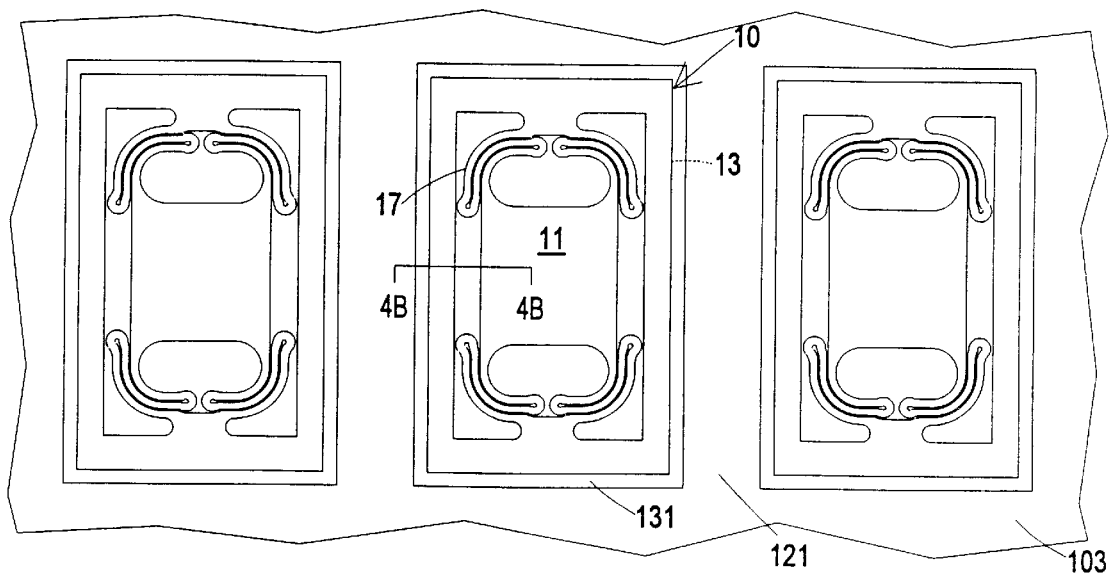
FIG. 4A is a plan view of part of the fabrication wafer in which micromechanical devices have been made using the basic method according to the invention.

FIG. 4A shows a small part of the surface of the fabrication wafer 103 during the fabrication of micromechanical devices using the basic method according to the invention described above. Three gimbals, including the gimbal 10, are shown as examples of micromechanical devices made using the basic method according to the invention. The micromechanical devices shown are part of a rectangular array of micromechanical devices covering the surface of the fabrication wafer. The metal pads have been omitted from the drawing to simplify it.

FIG. 4A shows the surface of the fabrication wafer 103 after the separation etch described above with reference to FIG. 3G has been performed to define the shape of the micromechanical devices and to separate the micromechanical devices from the fabrication wafer. In the basic method according to the invention, the etch resist layer 121 is patterned such that the separation etch forms the trench 131, which surrounds the mounting frame 13 of each micromechanical device and separates the mounting frame from the fabrication wafer 103.

Figure 4C:
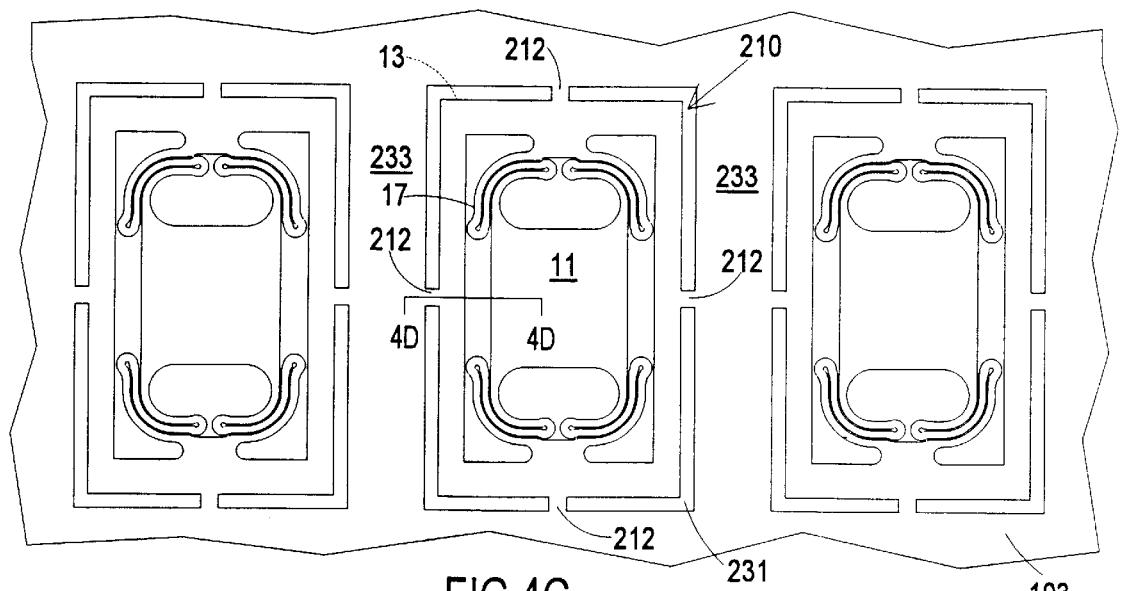
FIG. 4C is a plan view of part of the fabrication wafer in which micromechanical devices have been made using a first variation on the method according to the invention.
Figure 4B:
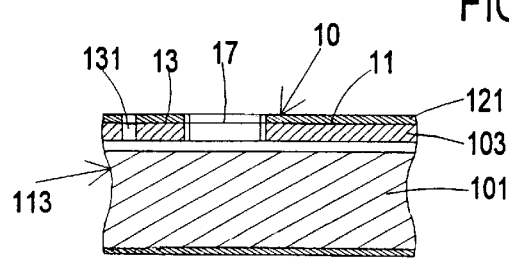
FIG. 4B is a cross sectional view along the line 4B—4B in FIG. 4A of one of the micromechanical devices made using the basic method according to the invention.

The cross-sectional view of FIG. 4B shows part of the bonded wafer pair 113 after the bonding release etch step described above with reference to FIG. 3H has been performed, and the bonding layer has been removed. After the bonding release etch step has been performed, the micromechanical devices and the fabrication wafer 103 are completely released from the handle wafer 101, and the micromechanical devices are completely separated from the fabrication wafer.

FIG. 4C shows a small part of the surface of the fabrication wafer 103 during the fabrication of micromechanical devices using a first variation on the basic method according to the invention. Three gimbals, including the gimbal 210, are shown as examples of micromechanical devices made using the first variation on the method according to the invention. The micromechanical devices shown are part of a rectangular array of micromechanical devices covering the surface of the fabrication wafer. The metal pads have been omitted from the drawing to simplify it.

FIG. 4C shows the surface of the fabrication wafer 103 after the separation etch described above with reference to FIG. 3G has been performed to define the shape of the micromechanical devices and to separate the micromechanical devices from the fabrication wafer. In the first variation on the method according to the invention, the etch resist layer 121 is patterned to define the tethers 212 interrupting the trench 231. The separation etch, which is preferably an anisotropic dry etch, then etches through the fabrication wafer 103 from its surface 117, remote from the handle wafer 101, to form the trench 231. The trench separates most of the mounting frame 213 from the part 233 of the fabrication wafer between adjacent micromechanical devices, except where it is interrupted by the tethers 212 that connect the micromechanical device to the fabrication wafer.

Figure 4D:
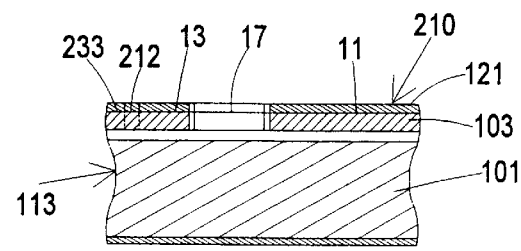
FIG. 4D is a cross sectional view along the line 4D—4D in FIG. 4B of one of the micromechanical devices made using the first variation on the method according to the invention.

The cross-sectional view of FIG. 4D shows part of the bonded wafer pair 113 after the bonding release etch step described above with reference to FIG. 3H has been performed, and the bonding layer has been removed. The bonding release etch step releases the fabrication wafer 103 from the handle wafer 101, but leaves the micromechanical devices, including the gimbal 210 as an example of a micromechanical device, attached to the part 233 of the fabrication wafer 103 between adjacent micromechanical devices by the tethers 212.

Additional processing can then be performed with the micromechanical devices attached to the fabrication wafer 103 and to one another. When the processing is completed, the micromechanical devices are released from the fabrication wafer by breaking the tethers. Preferably, the tethers are broken mechanically. However, they may be broken in other ways. For example, the tethers may be broken electrically or thermally.

The first variation described above enables additional processing to be performed before the micromechanical devices are completely released from the fabrication wafer 103. However, since the fabrication wafer is released from the handle wafer 101 by the bonding release etch step, this first variation deprives the fabrication wafer of the compatibility with wafer handling for conventional-thickness wafers conferred by the handle wafer. The fabrication wafer with the micromechanical devices partially separated from it is more difficult to handle than an unetched fabrication wafer of the same thickness, but in some respects is easier to handle than the individual micromechanical devices.

Figure 5A:
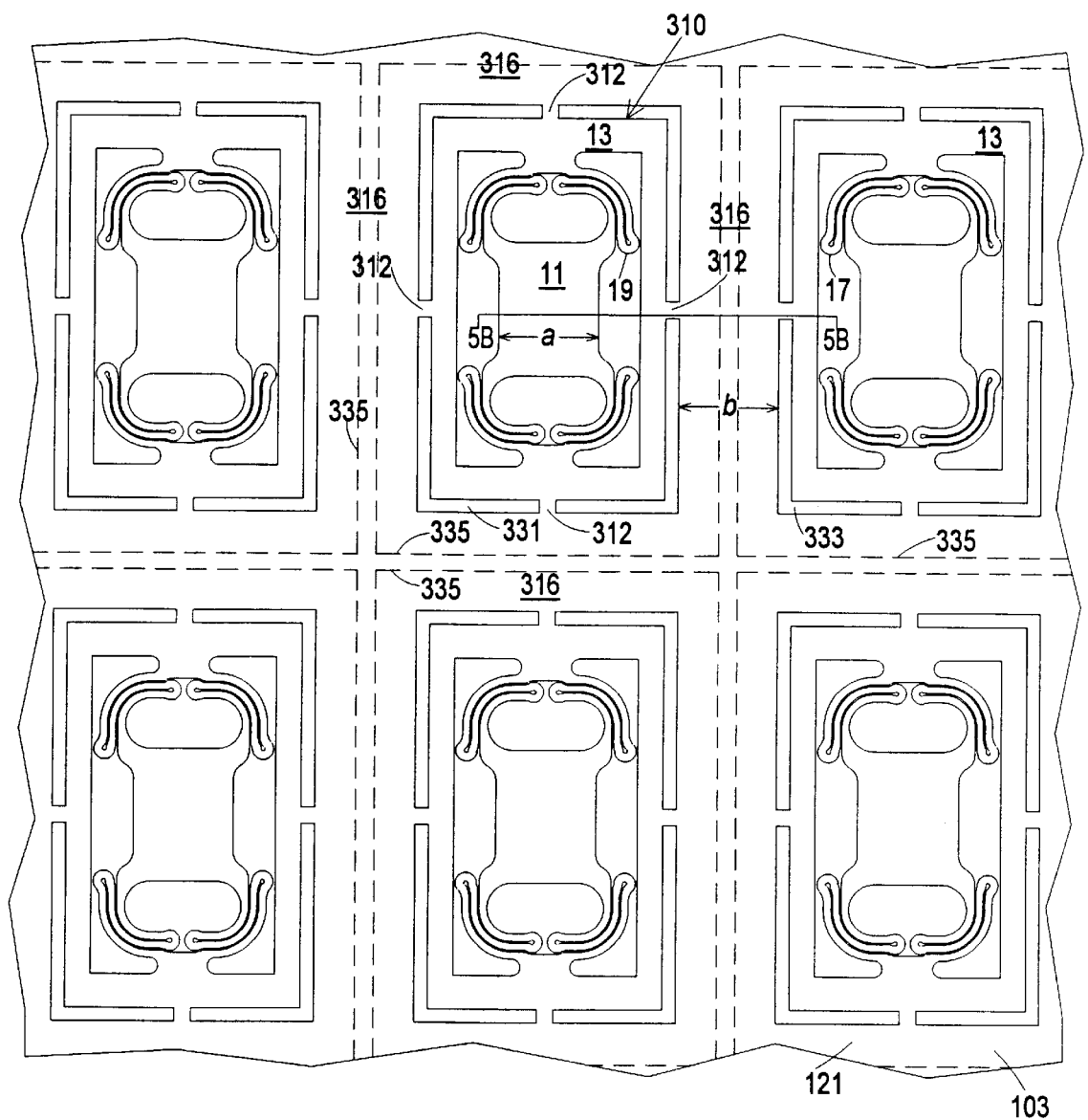
FIG. 5A is a plan view of part of the fabrication wafer in which micromechanical devices have been made using a second variation on the method according to the invention.

FIG. 5A shows a small part of the surface of the fabrication wafer 103 during the fabrication of micromechanical devices using a second variation on the method according to the invention described above. Six gimbals, including the gimbal 310, are shown as examples of micromechanical devices made using the second variation on the method according to the invention. The micromechanical devices shown are part of a larger rectangular array of micromechanical devices covering the surface of the fabrication wafer. The metal pads have been omitted from the micromechanical devices to simplify the drawing.

In the second variation on the method according to the invention, tether anchors connect the micromechanical devices formed in the fabrication wafer 103 to the handle wafer 101 via the tethers. The tether anchors are also formed in the fabrication wafer and are dimensioned such that, when the bonding release etch step is performed to release the micromechanical devices from the handle wafer, part of the bonding layer underlying each tether anchor remains. The part of the bonding layer that remains bonds the tether anchor to the handle wafer, and hence keeps the respective micromechanical device attached to the bonded wafer pair. Additional HF-etch incompatible processing can then be performed on the micromechanical devices with the convenience of having the micromechanical devices still attached to the bonded wafer pair. Finally, after completion of the additional processing, the micromechanical devices are released from the bonded wafer pair by breaking the tethers.

The etch resist layer 121 is patterned to define the tethers 312 and the tether anchors 316. Each tether interrupts the trench 331 to connect the respective micromechanical device to the respective tether anchor 316. In the example shown, the tether anchors of all the micromechanical devices are combined into a single extended element formed in the fabrication wafer. However, an individual tether anchor can be provided for each tether, or a shared tether anchor can be provided for all the tethers of each micromechanical device.

Each tether anchor 316 is dimensioned such that its etch distance is greater than the largest etch distance of the micromechanical devices. The etch distance of an object, such as the gimbal 310 or the tether anchor 316, is the largest distance that an etch front has to advance under the object to completely remove the bonding layer connecting the object to the handle wafer 101. For example, the largest etch distance of the gimbal 310 shown in FIG. 5A is approximately one-half of the width a of the head platform 311. The etch distance of the tether anchor 316 is one-half of the distance b between the trenches 331 and 333 bounding the tether anchor. Accordingly, the width of the tether anchor 316 is made such that the distance b between the trenches 331 and 333 is greater than the width a of the head platform to ensure that the bonding release etch step releases the micromechanical devices from the bonded wafer pair while the tether anchor still remains attached.

FIG. 5A shows the surface of the fabrication wafer 103 after the separation etch described above with reference to FIG. 3G has been performed. In the second variation on the method according to the invention, the etch resist layer 121 is patterned to define apertures through which the separation etch forms the trench 331, the tethers 312 and the tether anchors 316. The separation etch forms the trench 331 which separates the mounting frame 13 from the tether anchors 316 except where the trench is interrupted by the tethers 312. The tethers connect the mounting frame to the tether anchors.

Figure 5B:
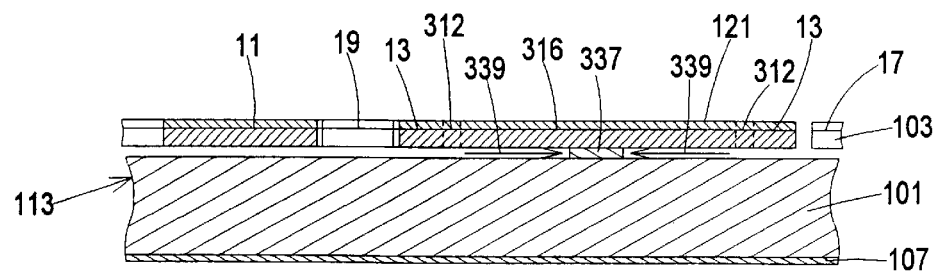
FIG. 5B is a cross sectional view along the line 5B—5B in FIG. 5A of one of the micromechanical devices made using the second variation on the method according to the invention.

The cross-sectional view of FIG. 5B shows part of the bonded wafer pair 113 after the bonding release etch step described above with reference to FIG. 3H has been performed. The bonding release etch step is performed for a time sufficient to completely remove the bonding layer under the micromechanical devices. During this time, etch fronts advance under the tether anchor 316 from the trenches 331 and 333 (FIG. 5A), bounding the tether anchor, as indicated by the arrows 339. However, by the time the micromechanical devices are completely released from the handle wafer 101, the etch fronts have advanced under the tether anchor only to the position indicated by the broken lines 335 in FIG. 5A. The tether anchor remains bonded to the handle wafer by the remaining part 337 of the bonding layer. Thus, in the second variation on the method according to the invention, the bonding release etch step separates the micromechanical devices from the handle wafer 101, but leaves the micromechanical devices attached to the bonded wafer pair by the tethers 312, the tether anchors 316, and the remaining part 337 of the bonding layer.

Additional processing can then be performed on the micromechanical devices while they remain attached to the bonded wafer pair 113. During the additional processing, some of the compatibility with wafer handling for conventional-thickness wafers conferred by the handle wafer on the fabrication wafer is maintained. Finally, when the additional processing is completed, the micromechanical devices are released from the bonded wafer pair by breaking the tethers 312.

In the example of fabricating micromechanical devices by the second variation of the method according to the invention illustrated in FIG. 5A, each micromechanical device is attached to the handle wafer 101 by one tether anchor 316 connected to each of its four sides. However, each tether anchor is shared between two adjacent micromechanical devices, so each micromechanical device is in effect attached by one tether anchor connected to each of two of its sides. With one tether anchor connected to each of two sides of each micromechanical device, the tether anchors occupy a non-negligible fraction of the area of the fabrication wafer 103. The area of the fabrication wafer occupied by the tether anchors can be reduced by moving either the rows or the columns of micromechanical devices closer together on the fabrication wafer. This eliminates the tether anchors attached to two of the four sides of each micromechanical device, and results in each micromechanical device being attached to the handle wafer by one tether anchor effectively connected to only one of its four sides.

Figure 6:
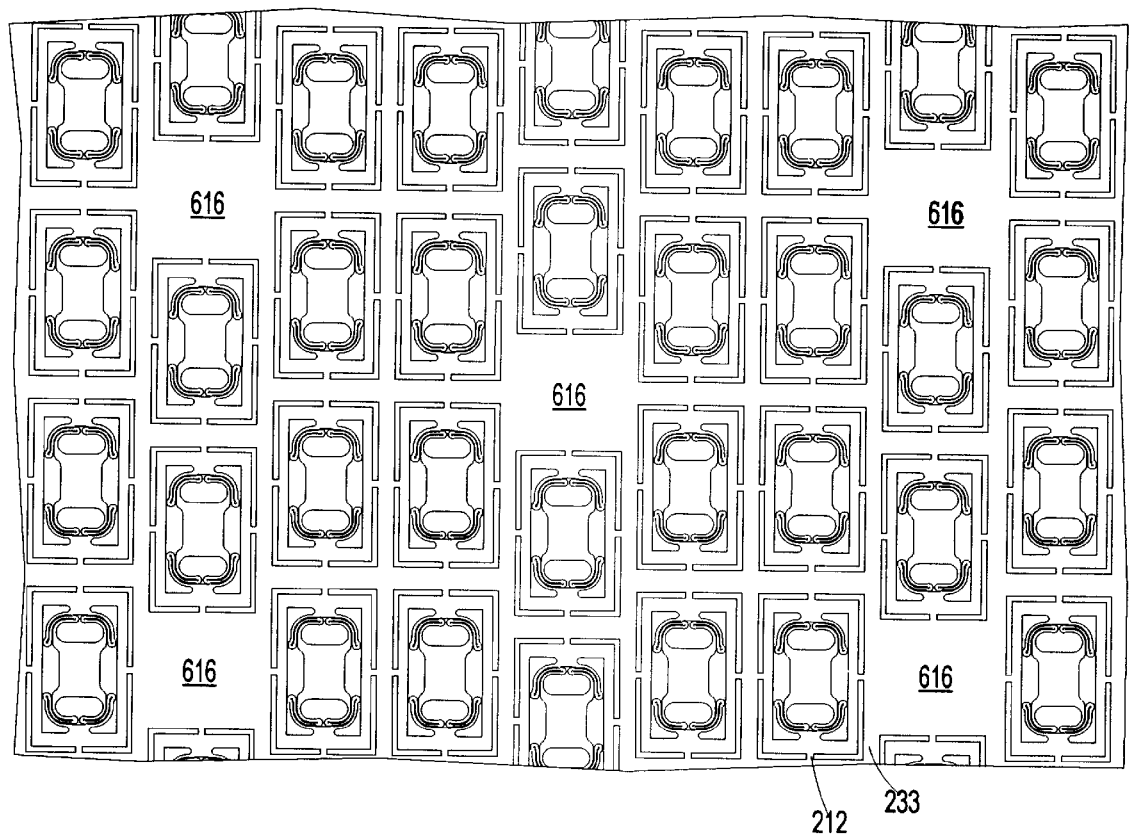
FIG. 6 is a plan view of part of the fabrication wafer in which micromechanical devices have been made with a layout that reduces the area of the fabrication wafer occupied by tether anchors.

Another alternative, in which the area of the fabrication wafer 103 occupied by the tether anchors is further reduced by sharing each tether anchor among more than two micromechanical devices, is shown in FIG. 6. In this alternative, the spacing between adjacent micromechanical devices in the fabrication wafer is reduced to the same as that in the first variation described above with reference to FIG. 4B. Tethers, such as the tether 212, connect the micromechanical devices to the portion 233 of the fabrication wafer. A tether anchor 616 occupying the area of one micromechanical device, or, preferably, the area of a fraction of one micromechanical device, is defined at every m-th position in every n-th row of the micromechanical devices in the fabrication wafer. Each tether anchor 616 is connected to the portion 233 of the fabrication wafer. Thus, the portion 233 of the fabrication wafer and the tethers, such as the tether 212, connect each tether anchor to the adjacent micromechanical devices.

Each tether anchor 616 is defined to have a greater etch distance than the largest etch distance of the micromechanical devices. After the bonding release etch step is performed, part of the bonding layer 105 remains under each tether anchor, and the micromechanical devices therefore remain connected to the bonded wafer pair via the tethers, such as the tether 212, the portion 233 of the fabrication wafer, and the tether anchors 616.

Although this disclosure describes illustrative embodiments of the invention in detail, it is to be understood that the invention is not limited to the precise embodiments described, and that various modifications may be practiced within the scope of the invention defined by the appended claims.

We claim:

1. A method for fabricating a thin micromechanical device in a way that is mechanically compatible with wafer handling for conventional-thickness wafers, the method comprising steps of:
providing a fabrication wafer;
providing a substantially conventional-thickness handle wafer;
bonding the fabrication wafer to the handle wafer by a removable bonding layer to form a bonded wafer pair;
forming the micromechanical device in the fabrication wafer by subjecting the bonded wafer pair to processing including wafer handling for conventional-thickness wafers, the micromechanical device being formed to include part of the fabrication wafer;
etching through the fabrication wafer to form a trench surrounding the micromechanical device, the trench separating the micromechanical device from the fabrication wafer and being interrupted by at least one tether connecting the micromechanical device to the fabrication wafer, the fabrication wafer being etched through from a face thereof remote from the handle wafer; and
removing the bonding layer underlying the micromechanical device to release the micromechanical device from the handle wafer.

2. The method of claim 1, in which:
in the step of providing a fabrication wafer, a fabrication wafer of conventional thickness is provided; and
the step of forming the micromechanical device in the fabrication wafer includes a step of reducing the thickness of the fabrication wafer to the thickness required for fabricating the micromechanical device.

3. The method of claim 2, in which, in the step of reducing the thickness of the fabrication wafer, the thickness of the fabrication wafer is reduced to a thickness in a range from about 10 $\mu$m to about 200 $\mu$m.

4. The method of claim 1, in which, in the step of bonding the fabrication wafer to the handle wafer, the removable bonding layer is a layer of a material chosen from a group consisting of phosphosilicate glass, arsenic glass, boron glass, boro-phosphosilicate glass, low-temperature oxide and thermal oxide.

5. The method of claim 1, in which, in the step of bonding the fabrication wafer to the handle wafer, the removable bonding layer includes phosphosilicate glass.

6. The method of claim 1, in which
the step of removing the bonding layer underlying the micromechanical device includes a step of applying an etchant to the bonding layer via the trench.

7. The method of claim 1, in which, in the step of etching through the fabrication wafer, the fabrication wafer is etched through anisotropically.

8. The method of claim 6, in which, in the step of applying an etchant to the bonding layer, an HF-based etchant is applied.

9. The method of claim 1, in which the step of removing the bonding layer underlying the micromechanical device releases the micromechanical device from the handle wafer but leaves the micromechanical device connected to the fabrication wafer by the at least one tether.

10. The method of claim 9, in which the step of removing the bonding layer underlying the micromechanical device additionally releases the fabrication wafer from the handle wafer.

11. The method of claim 9, additionally comprising a step of breaking the at least one tether to release the micromechanical device from the fabrication wafer.

12. The method of claim 11, additionally comprising a step of applying further processing to the micromechanical device after the step of removing the bonding layer and before the step of breaking the at least one tether.

13. The method of claim 1, in which:
the micromechanical device has a maximum etch distance;
the step of etching through the fabrication wafer additionally defines a tether anchor in the fabrication wafer, the tether anchor being connected to the micromechanical device by the at least one tether, the tether anchor being dimensioned to have an etch distance greater than the maximum etch distance of the micromechanical device; and
the step of removing the bonding layer underlying the micromechanical device is performed to remove the bonding layer underlying the micromechanical device but leaves part of the bonding layer underlying the tether anchor.

14. The method of claim 13, additionally comprising a step of breaking the at least one tether to release the micromechanical device from the bonded wafer pair.

15. A method for fabricating a thin micromechanical device in a way that is mechanically compatible with wafer handling for conventional-thickness wafers, the method comprising steps of:

provide a fabrication wafer;

providing a substantially conventional-thickness handle wafer;

bonding the fabrication wafer to the handle wafer by a removable bonding layer to form a bonded wafer pair;

forming the micromechanical device in the fabrication wafer by subjecting the bonded wafer pair to processing including wafer handling for conventional-thickness wafers, the micromechanical device including part of the fabrication wafer, the step of forming the micromechanical device in the fabrication wafer including a step of:

etching through the fabrication wafer to form a trench surrounding the micromechanical device, the trench separating the micromechanical device from the fabrication wafer, and being interrupted by at least one tether connecting the micromechanical device to the fabrication wafer, the fabrication wafer being etched through from a face thereof remote from the handle wafer;

removing the bonding layer underlying the micromechanical device to release the micromechanical device from the handle wafer, the micromechanical device remaining connected to the fabrication wafer by the at least one tether; and breaking the at least one tether to release the micromechanical device from the fabrication wafer.

16. The method of claim 15, in which:

in the step of providing a fabrication wafer, a fabrication wafer of conventional thickness is provided; and the step of forming the micromechanical device additionally includes a step of reducing the thickness of the fabrication wafer to the thickness required for fabricating the micromechanical device.

17. The method of claim 16, in which, in the step of bonding the fabrication wafer to the handle wafer, the removable bonding layer is a layer of a material chosen from a group consisting of phosphosilicate glass, arsenic glass, boron glass, boro-phosphosilicate glass, low-temperature oxide, and thermal oxide.

18. A method for fabricating a thin micromechanical device in a way that is mechanically compatible with wafer handling for conventional-thickness wafers, the method comprising steps of:

providing a fabrication wafer;

providing a substantially conventional-thickness handle wafer;

bonding the fabrication wafer to the handle wafer by a removable bonding layer to form a bonded wafer pair;

forming the micromechanical device in the fabrication wafer by subjecting the bonded wafer pair to processing including wafer handling for conventional-thickness wafers, the micromechanical device including part of the fabrication wafer, the step of forming the micromechanical device including a step of:

anisotropically etching through the fabrication wafer to form a trench surrounding the micromechanical device and to define a tether anchor in the fabrication wafer, the trench separating the micromechanical device from the fabrication wafer, the micromechanical device having a maximum etch distance, the trench being interrupted by at least one tether connecting the micromechanical device to the tether anchor, the tether anchor being dimensioned to have an etch distance greater than the maximum etch distance of the micromechanical device, the fabrication wafer being anisotropically etched through from a face thereof remote from the handle wafer;

removing the bonding layer underlying the micromechanical device to release the micromechanical device from the handle wafer, the micromechanical device remaining connected to the bonded wafer pair by the at least one tether, the tether anchor, and part of the bonding layer underlying the tether anchor; and breaking the at least one tether to release the micromechanical device from the bonded wafer pair.

19. The method of claim 18, in which, in the step of bonding the fabrication wafer to the handle wafer, the removable bonding layer is a layer of a material chosen from a group consisting of phosphosilicate glass, arsenic glass, boron glass, boro-phosphosilicate glass, low-temperature oxide and thermal oxide.

* * * * *